United States Patent
Ishimatsu et al.

(10) Patent No.: US 8,330,052 B2
(45) Date of Patent: Dec. 11, 2012

(54) JOINED STRUCTURE AND METHOD FOR PRODUCING THE SAME

(75) Inventors: Tomoyuki Ishimatsu, Tochigi (JP); Yukio Yamada, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 13/242,712

(22) Filed: Sep. 23, 2011

(65) Prior Publication Data

US 2012/0055703 A1    Mar. 8, 2012

Related U.S. Application Data

(63) Continuation of application No. PCT/JP2009/071657, filed on Dec. 25, 2009.

(30) Foreign Application Priority Data

Mar. 31, 2009   (JP) .................................. 2009-085577

(51) Int. Cl.
   *H05K 1/02*   (2006.01)
(52) U.S. Cl. ....... 174/259; 174/73.1; 174/257; 174/255; 174/261; 29/832; 29/830; 29/840; 29/846; 29/825
(58) Field of Classification Search .................. 174/255, 174/257, 261, 259, 73.1; 29/832, 830, 840, 29/825
See application file for complete search history.

(56) References Cited

U.S. PATENT DOCUMENTS

| | | | | |
|---|---|---|---|---|
| 5,084,961 A * | 2/1992 | Yoshikawa | ....................... | 29/840 |
| 5,428,190 A * | 6/1995 | Stopperan | ...................... | 174/261 |
| 6,211,936 B1 * | 4/2001 | Nakamura | ..................... | 349/152 |
| 6,449,836 B1 * | 9/2002 | Miyake et al. | ................... | 29/830 |
| 7,378,596 B2 * | 5/2008 | Kawaguchi et al. | ........... | 174/255 |
| 8,132,319 B2 * | 3/2012 | Arifuku et al. | ................... | 29/832 |
| 8,178,789 B2 * | 5/2012 | Takahashi et al. | ............. | 174/261 |
| 2005/0243528 A1 * | 11/2005 | Murayama | ..................... | 361/760 |
| 2008/0283284 A1 * | 11/2008 | Koyama et al. | ................ | 174/261 |
| 2012/0085579 A1 | 4/2012 | Tatsuzawa et al. | | |

FOREIGN PATENT DOCUMENTS

| | | |
|---|---|---|
| JP | 2001-119116 | 4/2001 |
| JP | 2002-358026 | 12/2002 |
| JP | 2003-066479 | 3/2003 |
| JP | 2007-041389 | 2/2007 |
| JP | 2007-053331 | 3/2007 |
| JP | 2007-193275 | 8/2007 |
| KR | 10-2008-0081353 | 9/2008 |
| WO | 2007/074652 | 7/2007 |

* cited by examiner

*Primary Examiner* — Hoa C Nguyen
(74) *Attorney, Agent, or Firm* — Carmody & Torrance LLP

(57) ABSTRACT

A method for producing a joined structure, containing: after placing an anisotropic conductive film in the predetermined manner, placing a wiring member containing a wiring plate formed thereon, where the wiring plate has a resist region in which the wiring plate is covered with a resist layer, and a second electrode region in which the wiring plate is not covered with the resist layer, so that the edge of the resist region at a boundary with the second electrode region comes above the chamfer part of the substrate; and heating and compressing the anisotropic conductive film from the side of the wiring member to melt and make the anisotropic conductive film flow into the side of the resist region to thereby cover the second electrode region with the anisotropic conductive film, so as to electrically connect the first electrode region and the second electrode region.

6 Claims, 8 Drawing Sheets

JOINED STRUCTURE AND METHOD FOR PRODUCING THE SAME

CROSS-REFERENCE TO RELATED APPLICATION

This is a continuation of Application No. PCT/JP2009/071657, filed on Dec. 25, 2009.

BACKGROUND OF TIM INVENTION

1. Field of the Invention

The present invention relates to a joined structure in which a substrate and a wiring member are connected via an anisotropic conductive film, and a method for producing the joined structure.

2. Description of the Related Art

Conventionally, when a substrate such as a LCD panel, and a PAP panel, and a wiring member such as FPC, COF, and TCP are joined together with an anisotropic conductive film, there are cases where wiring of the wiring member is exposed depending on the position of a resist layer formed in the wiring member. If the wiring member is used by bending in such the condition, there are problems that breaking of a wire may occur, and contaminants (dusts) or the like are included in the bare wiring part, which may cause occurrence of short circuit.

To solve these problems, for example, such a method has been proposed that a bare wiring part is protected with a sealant. Since a device for sealing and a cost thereof are additionally required, it is a current situation that the proposed method is not commonly used.

To this, for example, Japanese Patent Application Laid-Open (JP-A) No. 2002-358026 discloses a method for preventing breaking of wiring by sliding an insulating protective layer (resist layer) of FPC into the inside of a display panel to protect a bare wiring, and some panel manufacturers have put this method into practice.

In this technology, however, the flow of the anisotropic conductive adhesive is stopped by sliding the insulating protective layer into the inside of the display panel, which may cause short circuit, or connection failure occurs as a connection part is not sufficiently compressed during pressure bonding because of the presence of the insulating protective layer.

Moreover, JP-A No. 2003.66479 discloses a method of covering an exposed wiring part of a TAB component by extending and bonding an ACF tape to a solder resist part of the TAB component.

In this technique, however, heat from a heat tool is not easily transferred to the ACF tape extended from the connection part of the display panel and the TAB component, and the ACF tape of this area remains completely uncured. Therefore, there is a problem that durability thereof, such as bending strength, is poor.

BRIEF SUMMARY OF THE INVENTION

The present invention aims to solve the various problems in the art, and achieve the following object. Namely, an object of the present invention is to provide a joined structure capable of preventing connection failures, and having excellent connection reliability, and durability, and to provide a production method thereof.

The means for solving the problems mentioned above axe as follows:

<1> A method for producing a joined structure, containing:

after placing an anisotropic conductive film on a first electrode region formed on a substrate having a chamfer part at an edge thereof so that one edge of the anisotropic conductive film protrudes from the inner edge of the chamfer part of the substrate towards the outer side of the substrate, or the one edge of the anisotropic conductive film meets the inner edge of the chamfer part of the substrate, placing a wiring member containing a wiring plate formed thereon, where the wiring plate has a resist region in which the wiring plate is covered with a resist layer, and a second electrode region in which the wiring plate is not covered with the resist layer, so that the edge of the resist region at a boundary with the second electrode region comes above the chamfer part of the substrate; and heating and compressing the anisotropic conductive film from the side of the wiring member to melt and make the anisotropic conductive film flow into the side of the resist region to thereby cover the second electrode region with the anisotropic conductive Mm, so as to electrically connect the first electrode region and the second electrode region, wherein the substrate and the wiring member are joined together with the anisotropic conductive film to form the joined structure.

<2> The method for producing a joined structure according to <1>, wherein the placing the wiring member is placing the wiring member so that the one edge of the anisotropic conductive film and the edge of the resist region located at the boundary with the second electrode region are set apart, to thereby form an exposed wiring part in the second electrode region.

<3> The method for producing a joined structure according to any of <1> or <2>, wherein a width of the anisotropic conductive film protruding from the inner edge of the chamfer part of the substrate is 0% to 50% of a width of the anisotropic conductive film.

<4> The method for producing a joined structure according to any one of <1> to <3>, wherein the anisotropic conductive film has the minimum melt viscosity of $5.0 \times 10^1$ Pa·s to $1.0 \times 10^5$ Pa·s, and a thickness of 120% to 400% relative to the total height of a terminal in the first electrode region and a terminal in the second electrode region.

<5> The method for producing a joined structure according to any one of <1> to <3>, wherein the anisotropic conductive film contains an insulating layer and a conductive layer, where the insulating layer contains an insulating resin, and the conductive layer contains an insulating resin and conductive particles, and wherein the insulating layer has the minimum melt viscosity of $5.0 \times 10^1$ Pa·s to $1.0 \times 10^6$ Pa·s, and the conductive layer has the minimum melt viscosity which is larger than the minimum melt viscosity of the insulating layer by 10 times or more.

<6> A joined structure, containing:
an anisotropic conductive film;
a substrate containing a first electrode region formed thereon and having a chamfer part at an edge thereof; and
a wiring member, wherein the anisotropic conductive film and the wiring member are joined together with the anisotropic conductive film, wherein one edge of the anisotropic conductive film is placed on the first electrode region of the substrate so that the one edge of the anisotropic conductive film protrudes from the inner edge of the chamfer part of the substrate towards the outer side of the substrate, wherein the wiring member contains a wiring plate formed thereon, where the wiring plate has a resist region in which the wiring plate is covered with a resist layer, and a second electrode region in which the wiring plate is not covered with the resist layer, and the wiring member is placed so that the edge of the resist region at a boundary with the second electrode region comes above the chamfer part of the substrate, and wherein the second electrode region is covered with the anisotropic conductive film.

The present invention can provide a joined structure capable of preventing connection failures, and having excellent connection reliability, and durability, and provide a production method thereof.

BRIEF DESCRIPTION OF THE DRAWINGS

FIG. 5C is a cross-section photograph of the joined structure whose positional relationship after pressure bonding is Z4.

Figure 1A:
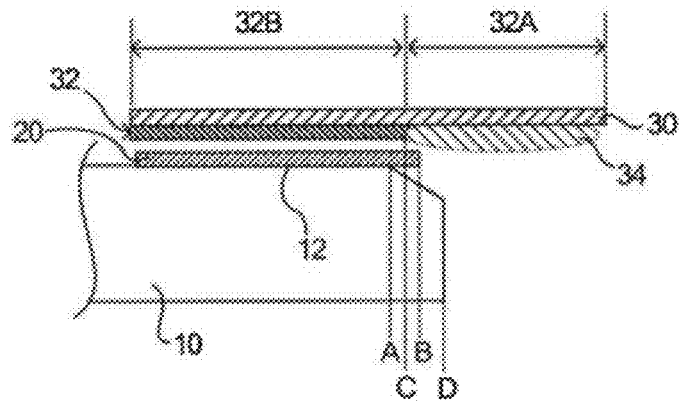
FIG. 1A is a schematic diagram illustrating one example of the positional relationship by the positioning step in the method for producing a joined structure of the present invention (part 1).

DETAILED DESCRIPTION OF THE INVENTION (Method for Producing Joined Structure)

The method for producing a joined structure of the present invention is a production method of a joined structure where a substrate and a wiring member are joined together with an anisotropic conductive film, and contains at least a positioning step and a electrode connecting step, and may further contains appropriately selected other steps, if necessary.
<Positioning Step>

The positioning is after placing an anisotropic conductive film on a first electrode region formed on a substrate having a chamfer part at an edge thereof so that one edge of the anisotropic conductive film protrudes from the inner edge of the chamfer part of the substrate towards outer side of the substrate, or the one edge of the anisotropic conductive film meets the inner edge of the chamfer part of the substrate, placing a wiring member containing a wiring plate formed thereon, where the wiring plate has a resist region in which part of the wiring plate is covered with a resist layer, and a second electrode region in which the wiring plate is not covered with the resist layer, so that the edge of the resist region at a boundary with the second electrode region comes above the chamfer part of the substrate.
—Substrate—

The substrate is appropriately selected depending on the intended purpose without any restriction. Examples thereof include LCD glass substrate (LCD glass panel), PDP glass substrate (PDP glass panel), and Organic EL glass substrate (organic EL glass panel).

The substrate is processed to have a chamfer part along the edge thereof, and has a slope from the inner edge of the chamfer part to the outer edge of the chamfer part (i.e. the outer edge of the substrate).

Moreover, in the substrate, a first electrode region is formed at the side of the substrate inner than the inner edge of the chamfer.
—Wiring Member—

The wiring member is appropriately selected depending on the intended purpose without any restriction, and examples thereof include FPC, COF, and TOP.

A wiring plate is formed on one surface of the wiring member.

The wiring plate has a resist region and a second electrode region, where the resist region is part of the wiring plate and is the region where the siring plate 18 covered with a resist layer (e.g. a solder resist layer), and the second electrode region is a region where the wiring plate is not covered with the resist layer.
—Anisotropic Conductive Film—

The structure, size, thickness, and the like of the anisotropic conductive film are appropriately selected depending on the intended purpose without any restriction.

The structure of the anisotropic conductive film may be a single layer structure, or a laminate structure.

In the case of the anisotropic conductive film of the single layer structure, the anisotropic conductive film consists of an insulating resin layer containing conductive particles therein.

The conductive particles are not particularly restricted, and as the conductive particles, conductive particles for use in conventional isotropic conductive adhesives can be used. For example, metal particles, or metal coated resin particles having diameters of 1 µm to 50 µm can be used.

Examples of the metal particles include nickel particles, cobalt particles, and copper particles. For the purpose of preventing surface oxidation of these metal particles, particles surfaces of which are coated with gold, or paradigm may be used. Moreover, the metal particles may have metal protrusions on the surfaces thereof or may have insulating coating formed of an organic material.

Examples of the metal-coated resin particles include spherical particles each plated with at least one metal selected from nickel, cobalt, copper, and the like. Particles whose outermost surfaces are each coated with gold, or palladium in the same manner may be also used as the metal-coated resin particles. Moreover, the metal coated resin particles may have metal protrusions on the surfaces thereof, or may have insulating coating formed of an organic material.

The insulating resin for use in the insulating resin layer is appropriately selected depending on the intended purpose without any restriction. Examples thereof include an epoxy resin, and an acrylic resin.

The epoxy resin is appropriately selected depending on the intended purpose without any restriction, and examples thereof include a bisphenol A epoxy resin, a bisphenol F epoxy resin, and a novolak epoxy resin. These may be used independently, or in combination.

The acrylic resin is appropriately selected depending on the intended purpose without any restriction. Examples thereof include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, and urethane acrylate. These may be used independently, or in combination.

Moreover, acrylic resins in which the preceding acrylates are replaced with methacrylates are also included in the examples. There may be used independently, or in combination.

Moreover, the epoxy resin and the acrylic resin may each further include a thermoplastic resin, such as a phenoxy resin, a polyurethane resin, and a polyester resin, if necessary.

Furthermore, in the epoxy resin and the acrylic resin, an appropriate curing agent to each resin may is used.

The curing agent for use in the epoxy resin is appropriately selected depending on the intended purpose without any restriction. Examples thereof include: an anionic curing agent such as organic amines (e.g. imidazole, and triethyl amine); and a cationic curing agent such as onium salts, sulfonium salts, an aluminum chelating agent, and organic acids.

The curing agent for use in the acrylic resin is appropriately selected depending on the intended purpose without any restriction. Examples thereof include: organic peroxides such as dicumyl peroxide, t-butyl peroxide, dilauroyl peroxide, and dibenzoyl peroxide; and derivatives thereof.

The curing method of the insulating resin can be appropriately selected from thermal curing and photo curing.

In the case of the anisotropic conductive film of the single layer structure, the minimum melt viscosity of the anisotropic conductive film is preferably $6.0 \times 10^1$ Pa·s to $1.0 \times 10^5$ Pa·s, more preferably $1.0 \times 10^2$ Pa·s to $1.0 \times 10^4$ Pa·s.

When the minimum melt viscosity thereof is lower than $5.0 \times 10^1$ Pa·s, in the case where the anisotropic conductive film is produced as a film reel in which the anisotropic conductive film is wound around a reel, the anisotropic conductive film may bleed out due to tight drawing, and this may cause blocking. When the minimum melt viscosity thereof is higher than $1.0 \times 10^5$ Pa·s, the anisotropic conductive film is not sufficiently removed at the time when the substrate and the wiring member are connected by heating and compressing, and this may cause connection failures.

The minimum melt viscosity can be measured, for example, by a rotational rheometer (HAAKE RheoStzess RS-160, manufactured by Thermo Fisher Scientific K.K.), and the conditions for the measurement are, for example, the temperature increase rate of 10° C./min, frequency of 1 Hz, applied pressure of 1 N, and measurement temperature of 30° C. to 180° C.

Moreover, the thickness of the anisotropic conductive film is preferably 120% to 400%, more preferably 160% to 300% of the total height of a terminal formed in the first electrode region and a terminal formed in the second electrode region.

When the thickness thereof is less than 120% of the total height of the terminals, the anisotropic conductive film may not sufficiently fill between the terminal of the substrate and the terminal of the wiring member. When the thickness thereof is more than 400%, the anisotropic conductive film is not sufficiently removed at the time when the substrate and the wiring member are connected by heating and compressing, this may cause connection failures, or misalignment due to sliding of the wiring member occurred as it is pressed.

In the case of the anisotropic conductive film of the laminate structure, the anisotropic conductive film contains an insulating layer including an insulating resin, and a conductive layer including an insulating resin and conductive particles. Such the anisotropic conductive film covers an exposed wiring part with the insulating layer not including the conductive particles, and therefore occurrences of short circuit can be prevented.

The insulating resin for use in the insulating layer is appropriately selected depending on the intended purpose without any restriction, and the insulating resins that can be used in the anisotropic conductive film of the single layer structure can be used.

The minimum melt viscosity of the insulating layer is appropriately selected depending on the intended purpose without any restriction, but it is preferably $5.0 \times 10^1$ Pa·s to $1.0 \times 10^5$ Pa·s, more preferably $1.0 \times 10^2$ Pa·s to $4.0 \times 10^4$ Pa·s.

When the minimum melt viscosity is lower than $5.0 \times 10^1$ Pa·s, in the case where the anisotropic conductive film is produced as a film reel in which the anisotropic conductive film is wound around a reel, the anisotropic conductive film may bleed out due to tight drawing, and this may cause blocking. When the minimum melt viscosity is higher than $1.0 \times 10^5$ Pa·s, the anisotropic conductive film is not sufficiently removed at the time when the substrate and the wiring member are connected by heating and compressing, and this may cause connection failures.

The insulating resin and the conductive particles for use in the conductive layer are appropriately selected depending on the intended purpose without any restriction. For example, those used in the anisotropic conductive film of the single structure can be used.

The minimum melt viscosity of the conductive layer is appropriately selected depending on the intended purpose without any restriction, and it is preferably higher than the minimum melt viscosity of the insulating layer, more preferably larger than the minimum melt viscosity of the insulating layer by 10 times or more.

When the minimum melt viscosity of the conductive layer is larger than the minimum melt viscosity of the insulating layer by 10 times or more, the flow of the conductive particles can be prevented, this results the reduction in occurrences of short circuit due to clogging of the conductive particles.

Each thickness of the insulating layer and conductive layer is appropriately selected depending on the intended purpose without any restriction, but the sum of the thicknesses (the total thickness) thereof is preferably 120% to 400%, more preferably 150% to 300% of the total height of the terminal in the first electrode region and the terminal in the second electrode region.

When the total thickness is less than 120%, the anisotropic conductive film may not sufficiently fill between the terminal of the substrate and the terminal of the wiring member. When the total thickness of more than 400%, the anisotropic conductive film is not sufficiently removed at the time when the substrate and the wiring member are connected by heating and compressing, this may cause connection failures, or misalignment due to sliding of the wiring member occurred as it is pressed.

One example of the positional relationship of the substrate, the anisotropic conductive film, and the wiring member determined in the positioning will be explained with reference to drawings, hereinafter.

Figure 1B:
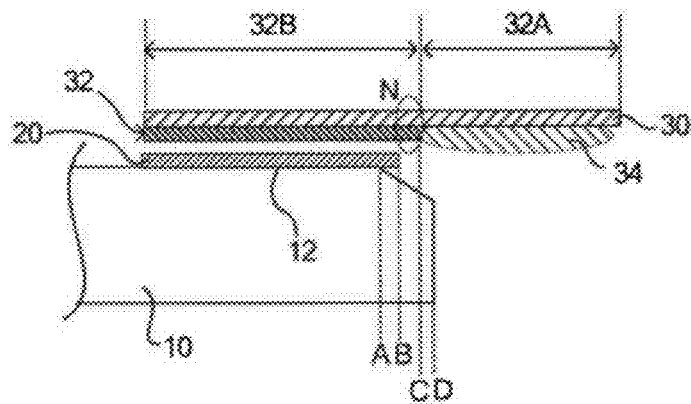
FIG. 1B is a schematic diagram illustrating one example of the positional relationship by the positioning step in the method for producing a joined structure of the present invention (part 2).

As illustrated in FIGS. 1A and 1B, at first, the anisotropic conductive film 20 is placed on the first electrode region 12 formed on the substrate 10, so that one edge (B) of the anisotropic conductive film 20 protrudes from the inner edge (A) of the chamfer part of the substrate 10 toward the outer side of the substrate 10. Then, the wiring member 30 containing the wiring plate 32 formed thereon is placed so that the edge (C) of the resist region 32A, which is a region of the wiring plate 32 covered with a resist layer 34, at the boundary with the second electrode region 32B, which is a region of the wiring plate 32 without being covered with the resist layer 34, comes above the chamfer part of the substrate 10 (between the inner edge (A) of the chamfer part and the outer edge (D) of the chamfer part).

As a result, in FIG. 1A, the inner edge (A) of the chamfer part of the substrate, the edge (C) of the resist region 32A, the one edge (B) of the anisotropic conductive film 20, and the outer edge (D) of the chamfer part of the substrate are placed in this order from the left side of FIG. 1A, Note that, in the embodiment illustrated in FIG. 1A, the positions of B and D are replaced to arrange A, C, D, and B in this order.

Moreover, in FIG. 1B, the inner edge (A) of the chamfer part of the substrate, the one edge (B) of the anisotropic conductive film 20, the edge (C) of the resist region 32A, and the outer edge (D) of the chamfer part of the substrate are placed in this order from the left side of FIG. 1B.

A width of the anisotropic conductive film protruding from the inner edge of the chamfer part of the substrate is appropriately selected depending on the intended purpose without any restriction. It is preferably 0% to 50%, more preferably 0% to 30% of the width of the anisotropic conductive film.

When the protruding width is less than 0%, namely, in the case where one edge of the anisotropic conductive film is located at the inner side of the substrate than the inner edge of the chamfer part of the substrate, the extruded anisotropic conductive film after the connecting the substrate and the wiring member does not reach the resist layer on the wiring plate, and therefore the second electrode region (exposed wiring part) may not be protected. When the protruding width is more than 50%, the anisotropic conductive film may not be sufficiently adhered to the substrate.

Figure 1C:
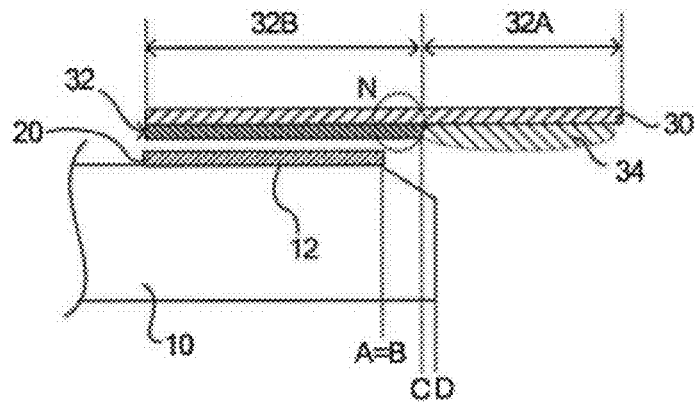
FIG. 1C is a schematic diagram illustrating one example of the positional relationship by the positioning step in the method for producing a joined structure of the present invention (part 3).

Moreover, as illustrated in FIG. 1C, the anisotropic conductive film 20 may be placed on the first electrode region 12 formed on the substrate 10 so that one edge (B) of the anisotropic conductive film 20 meets the inner edge (A) of the chamfer part of the substrate 10. In this case, the inner edge (A) of the chamfer part of the substrate and the one edge (B) of the anisotropic conductive film 20 are arranged in the same position, and these edges (A) and (B), and the edge (C) of the resist region 32A, and the outer edge (D) of the chamfer part of the substrate are arranged in this order from the left side of FIG. 1C.

Moreover, in the positioning, a space may be provided between the one edge of the anisotropic conductive film and the edge of the resist region at the boundary with the second electrode region to thereby form an exposed wiring part in the second electrode region. Specifically, as illustrated in FIGS. 1B and 1C, by arranging the one edge (B) of the anisotropic conductive film 20 and the edge (C) of the resist region 32A to set apart, a space is provided in the second electrode region 32B to thereby form an exposed wiring part N. In this case, the resist layer is not provided on the upper plane of the anisotropic conductive film, and therefore the anisotropic conductive film can be sufficiently compressed in the electrode connecting step mentioned later, which is advantageous because occurrences of connecting failure can be inhibited.

Note that, in the electrode connecting step, the anisotropic conductive film 20, which has been heated and compressed, is melted and flows into the side of the resist region 32A, and then into the bottom side of the resist layer 34. As a result, the exposed wiring part N is covered with the anisotropic conductive film 20.

<Electrode Connecting Step>

The electrode connecting step is heating and compressing the anisotropic conductive film from the side of the wiring member to melt and make the anisotropic conductive film flow into the side of the resist region to thereby cover the second electrode region with the anisotropic conductive film, so as to electrically connect the first electrode region and the second electrode region.

The heating is changed depending on the insulating resin or curing agent for use, but the heating is generally formed at the contact duration of 10 seconds or shorter, and the pressure of 2 MPa to 6 MPa.

Once the anisotropic conductive film is heated and compressed in the electrode connecting step, the anisotropic conductive film is melted to flow into the side of the resist region, to thereby completely cover the second electrode region with the anisotropic conductive film. As a result, the first electrode region and the second electrode region are electrically connected, and the substrate and the wiring member are joined.

Here, one example of the state after the electrode connecting step is explained with reference to a drawing.

Figure 2:
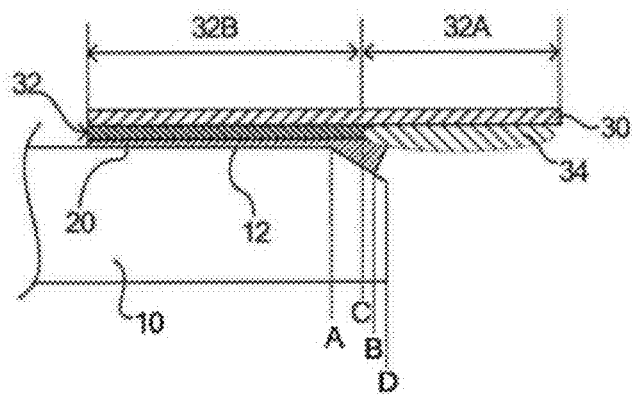
FIG. 2 is a schematic diagram illustrating one example of the joined structure produced by the method for producing a joined structure of the present invention.

As illustrated in FIG. 2, in the electrode connecting step, the heated and compressed anisotropic conductive film 20 is melted and made flow into the side of the resist region 32A, followed by moving into the bottom side of the resist layer 34. As a result, the second electrode region 32B is completely covered without leaving an exposed wiring part so that occurrence of short circuit due to inclusion of foreign matter (i.e. contamination) is prevented.

(Joined Structure)

The joined structure of the present invention contains: an anisotropic conductive film; a substrate containing a first electrode region formed thereon and having a chamfer part at an edge thereof, and a wiring member connected with the substrate via the anisotropic conductive film, in which one edge of the anisotropic conductive film is placed on the first electrode region of the substrate so that one edge of the anisotropic conductive film protrudes from the inner edge of the chamfer part of the substrate towards the outer side of the substrate; the wiring member contains a wiring plate formed thereon, where the wiring plate has a resist region in which part of the wiring plate is covered with a resist layer, and a second electrode region in which the wiring plate is not covered with the resist layer, and the wiring member is placed so that the edge of the resist region at a boundary with the second electrode region comes above the chamfer part of the substrate; and the second electrode region is covered with the anisotropic conductive film.

Note that the details of the substrate, the wiring member, the anisotropic conductive film and the like are as mentioned earlier.

In the joined structure of the present invention, as illustrated in FIG. 2, the edge (C) of the resist region 32A comes above the chamfer part of the substrate (i.e. between the inner edge (A) of the chamfer part and the outer edge (D) of the chamfer part). Therefore, the joined structure has high connection reliability and excellent durability such as bending strength.

Specifically, in the case where the edge (C) of the resist region 32A is positioned in the inner side of the substrate 10 than the inner edge (A) of the chamfer part, the anisotropic conductive film 20 cannot be sufficiently compressed during the production of the joined structure because of the presence of the resist layer 34, which may become a factor of causing connection failures. In the case where the edge (C) of the resist region 32A is positioned in the outer side compared to the outer edge (D) of the chamfer part of the substrate 10, moreover, the anisotropic conductive film 20 is bonded to the wiring member in the manner that the anisotropic conductive film 20 protrudes from the substrate 10 to corresponding the edge (C) of the resist region 92A. However, a part of the anisotropic conductive film 20 present outside the substrate 10 does not receive heat from a heat tool so that it remains completely uncured, this may result poor durability of the resulting joined structure, such as in terms of the bending strength thereof.

EXAMPLES

The present invention will be more specifically explained through Examples and Comparative Examples hereinafter, but Examples shall not be construed as limiting the scope of the present invention in any way.

Production Examples 1 to 5

Anisotropic Conductive Films T1 to T5

Conductive particles (AUL704, manufactured by SEKISUI CHEMICAL CO., LTD.) were dispersed an adhesive containing 50 parts by mass of a phenoxy resin (PKHC, manufactured by TOMOE ENGINEERING CO., LTD.), 45 parts by mass of a radical polymerizable resin (EB-600, manufactured by DAICEL-CYTEC COMPANY LTD.), 2 parts by mass of a silane coupling agent (KBM-603, manufactured by Shin-Etsu Chemical Co., Ltd.), 3 parts by mass of hydrophilic silica serving as a thickener (AEROSIL972, manufactured by EVONIK), and 3 parts by mass of a reaction initiator (PERHEXA C, manufactured by NOF CORPORATION) to give a particle density of 5,000 particles/mm$^2$. The resultant was shaped to thereby obtain anisotropic conductive films T1 to T5, having thickness of 8 μm, 10 μm, 15 μm, 30 μm, and 35 μm, respectively.

Production Examples 6 to 8

Anisotropic Conductive Films V1 to V3

Anisotropic conductive films V1 to V3 each having a thickness of 15 μm were prepared by adding 0 parts by mass, 6 parts by mass, or 9 parts by mass of hydrophobic silica serving as a thickener (AEROSIL972, manufactured by EVONIK), respectively, to an adhesive containing 50 parts by mass of a phenoxy resin (PKHC, manufactured by TOMOE ENGINEERING CO., LTD.), 45 parts by mass of a radical polymerizable resin (EB-600, manufactured by DAICEL-CYTEC COMPANY LTD.), 2 parts by mass of a silane coupling agent (KBM-503, manufactured by Shin-Etsu Chemical Co., Ltd.), and 3 parts by mass of a reaction initiator (PERHEXA C, manufactured by NOF CORPORATION), and dispersing conductive particles (AUL704, manufactured by SEKISUI CHEMICAL CO., LTD.) in the resulting adhesive to give a particle density of 5,000 particles/mm$^2$.

Production Example 9

Two-Layer Structure Anisotropic Conductive Film D1

A two-layer structure anisotropic conductive film D1 having a thickness of 15 μm was obtained by laminating an insulating layer (NCF) and a conductive layer (ACF) using a laminator, where the insulating layer (NCF) was prepared in the same manner as in Production Example 1 provided that the conductive particles were not added and the shaping was performed to give a thickness of 10 μm, and the conductive layer (ACF) was prepared in the same manner as in Production Example 7 provided that the adhesive containing 6 parts by mass of the hydrophobic silica was shaped to give a thickness of 5 μm.

—Measurement of Melt Viscosity—

The obtained anisotropic conductive films T1 to T5, V1 to V5, and D1 were subjected to the measurement of melt viscosity.

At first, each anisotropic conductive film was laminated to prepare a sheet having a thickness of 300 μm. Then, the melt viscosity of the obtained sheet was measured by means of a rotational rheometer (HAAKE RheoStress RS-150, manufactured by Thermo Fisher Scientific K.K.) at the temperature increase rate of 10° C./min, frequency of 1 Hz, applied pressure of 1 N and measurement temperature range of 30° C. to 180° C. The results are shown in Table 1.

Next, the anisotropic conductive films T1 to T5, V1 to V3, and D1 were each cut into a width of 1.5 mm, followed by winding to prepare a film reel 50M and a film reel 100M.

—Bleeding Test—

A film strength test of the anisotropic conductive film was performed by suspending a 50 g weight from the obtained film reel 100M in the normal temperature environment. Twenty four hours later, the condition of the film reel 100M that the anisotropic conductive film was completely rolled out from the reel was judged as "OK," and the condition that the anisotropic conductive film could not be regularly rolled out in the middle of the procedure, because of bleeding of the anisotropic conductive film caused by tight drawing. The film strength of each anisotropic conductive film in the film reel 50M was measured and evaluated in the same manner. The results were evaluated based on the following criteria. The results are shown in Table 1.

[Evaluation Criteria]

A: The film reel 100M and the film reel 50M were both "OK."

B: The film reel 100M was "NG" but the film reel 50M was "OK."

Next, a joined structure was prepared from ITO coating glass, COF, and the anisotropic conductive film according to the positional relationship of Z1 to Z7.

In the positional relationships Z1 to Z7, before the pressure bonding of the ITO coating glass and the COF, the inner edge (A) of the chamfer part of the ITO coating glass, one edge (B) of the anisotropic conductive film, the edge (C) of the solder resist region of the COF, and the outer edge (D) of the chamfer part of the ITO coating glass were arranged in the following order from the left side in the respective drawing.

[Positional Relationship before Pressure Bonding]

Figure 3A:
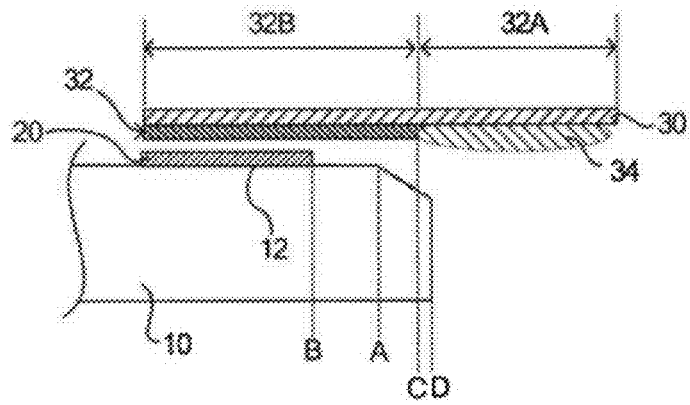
FIG. 3A is a schematic diagram illustrating positional relationship before pressure bonding Z1.

Z1 (Comparative Example; FIG. 3A): B, A, C, D

Figure 3B:
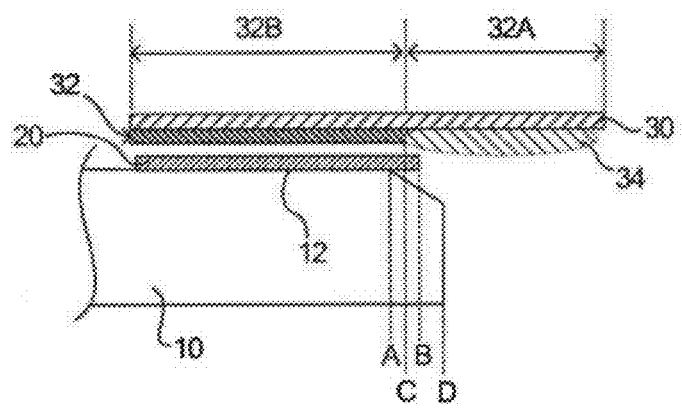
FIG. 3B is a schematic diagram illustrating positional relationship before pressure bonding Z2.

Z2 (Example; FIG. 3B): A, C, B, D

Figure 3C:
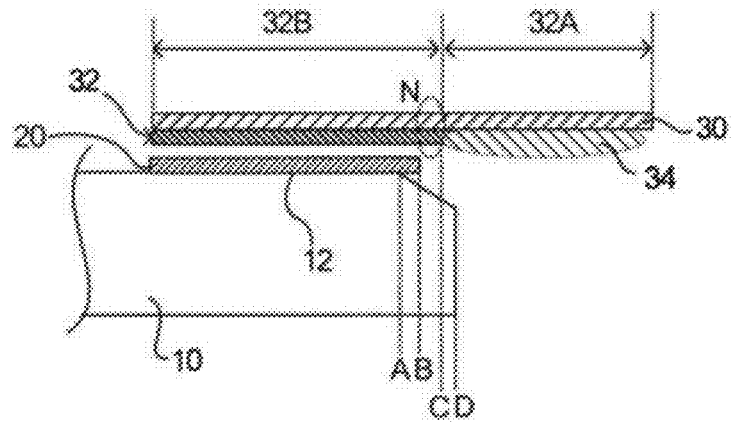
FIG. 3D is a schematic diagram illustrating positional relationship before pressure bonding Z4.
FIG. 3E is a schematic diagram illustrating positional relationship before pressure bonding Z5.
FIG. 3F is a schematic diagram illustrating positional relationship before pressure bonding Z6.
FIG. 3G is a schematic diagram illustrating positional relationship before pressure bonding Z7.

Z3 (Example; FIG. 3C): A, B, C, D

Figure 3D:
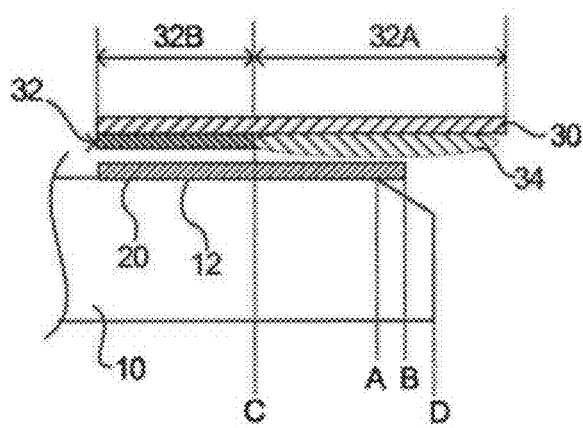

Z4 (Comparative Example; FIG. 3D): C, A, B, D

Figure 3E:
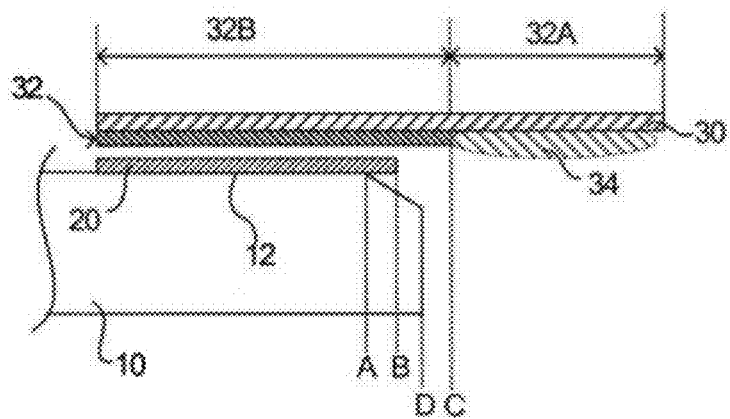

Z5 (Comparative Example; FIG. 3E): A, B, D, C

Figure 3F:
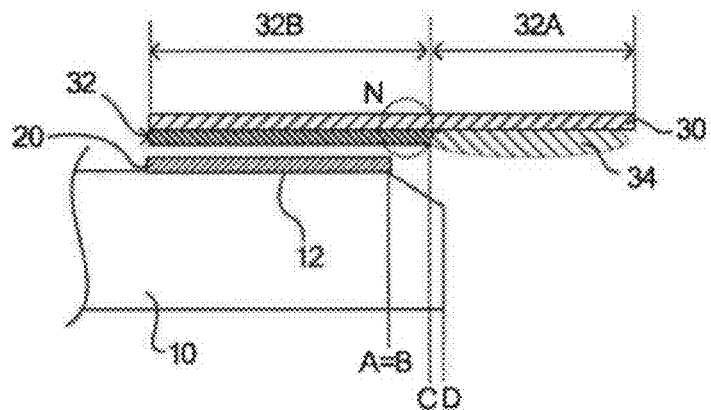

Z6 (Example; FIG. 3F): A=B, C, D

Figure 3G:
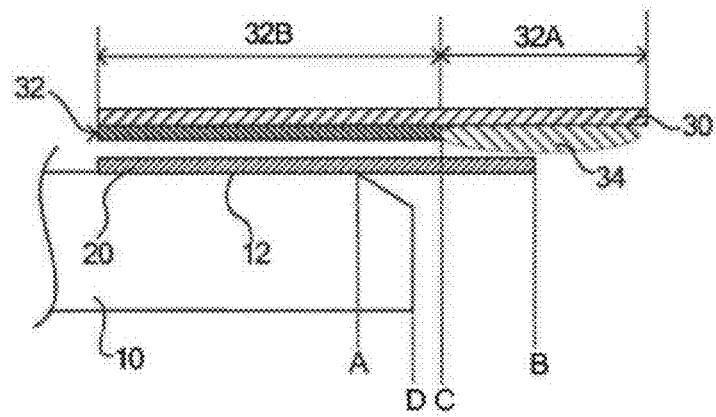

Z7 (Comparative Example; FIG. 3G): A, D, C, B

Example 1

Preparation of Joined Structure

An ITO coating glass (a substrate for evaluation entire surface of which had been coated with ITO, glass thickness of 0.7 mm, chamfer of 0.3 mm, terminal height of 0.4 μm (4,000 Å)) as the substrate, and COF (a substrate for evaluation, 50 μm pitch, Cu (8 μm thick, i.e. terminal height of 8 μm)—Sn plated solder resist: polyimide (PD) based, PI (38 μm, thick) S'PERFLEX base material) as the wiring member were joined together.

At first, according to the positional relationship of Z3 (see FIG. 30), as the anisotropic conductive film 20, each of the anisotropic conductive films T2 to T5, V1 to V2, and D1 which had been cut into a width of 1.5 mm were temporally adhered to an ITO contact glass as the substrate 10, and onto this, a COF as the wiring member 30 was temporally fixed (the positioning step).

Next, with a heat toll having a width of 1.5 mm, the anisotropic conductive film 20 was heated and compressed from the aide of COF 30 for 10 seconds at 190° C., and 4 MPa using a buffer (Teflon (registered trademark)) having a thickness of 100 μm. By this, the anisotropic conductive film 20 was melted to flow into the side of the resist region 32A to thereby cover the second electrode region 32B, and electrically connect the first electrode region 12 and the second electrode region 32B (the electrode connecting step). In the manner as mentioned, a joined structure was obtained.

Comparative Example 1

Preparation of Joined Structure

Joined structures were prepared in the same manner as in Example 1, provided that as the anisotropic conductive film, the anisotropic conductive films T1 and V3 produced in Production Example 1 were used.

Example 2 and Comparative Example 2

Joined structures were prepared in the same manner as in Example 1, provided that as the anisotropic conductive film, anisotropic conductive film T3 was used, and the positional relationship of the ITO coating glass, COF, and anisotropic conductive film T3 were changed according to the positional relationships Z1 to Z7.

The obtained joined structures were observed after pressure bonding of the ITO coating glass and COF to confirm the positional relationship of the inner edge (A) of the chamfer part of the ITO coating glass, the one edge (B) of the anisotropic conductive film, the edge (C) of the solder resist region of the COF, and the outer edge (D) of the chamfer part of the ITO coating glass, and were evaluated in terms of the positional relationship (arrangement from the left side in the respective drawing). The results are shown in Tables 1 and 2.

[Positional Relationship after Pressure Bonding]

Figure 4A:
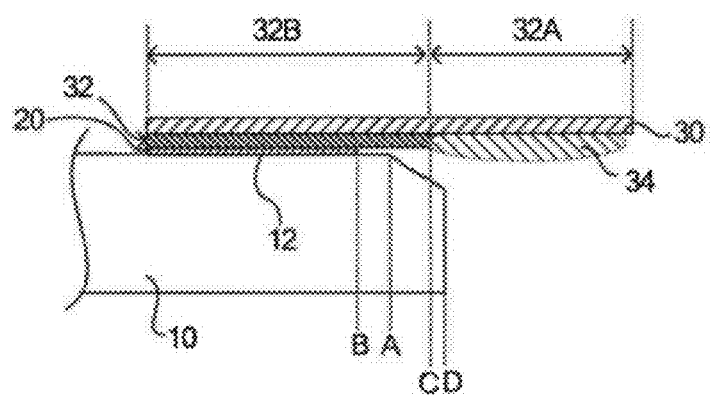
FIG. 4A is a schematic diagram illustrating positional relationship after pressure bonding Z1.

Z1 (Comparative Example; FIG. 4A): B, A, C, D

Figure 4B:
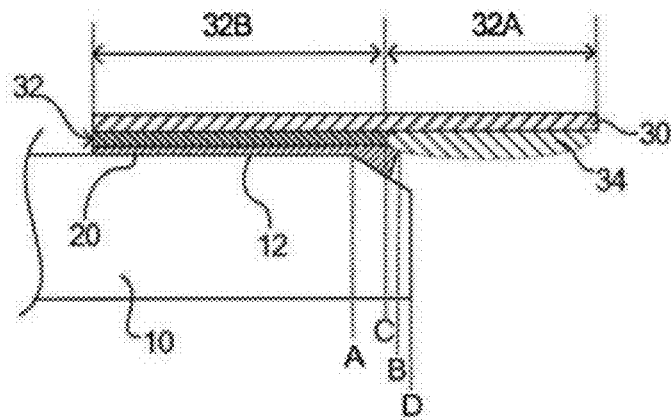
FIG. 4B is a schematic diagram illustrating positional relationship after pressure bonding Z2.

Z2 (Example; FIG. 4B): A, C, B, D

Figure 4C:
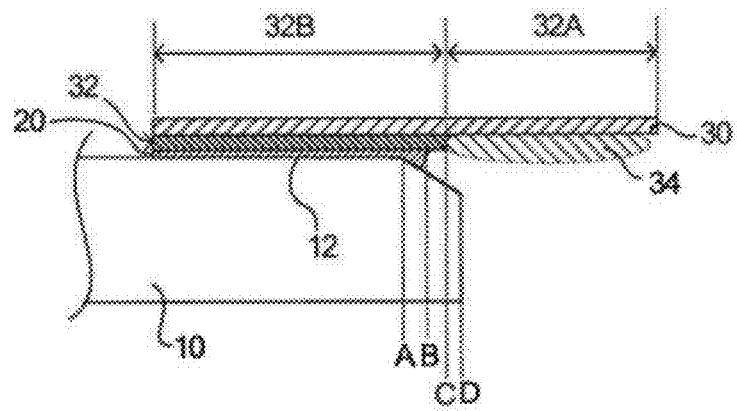
FIG. 4C is a schematic diagram illustrating positional relationship after pressure bonding Z3.

Z3 (Comparative Example; FIG. 4C): A, B, C, D

Figure 4D:
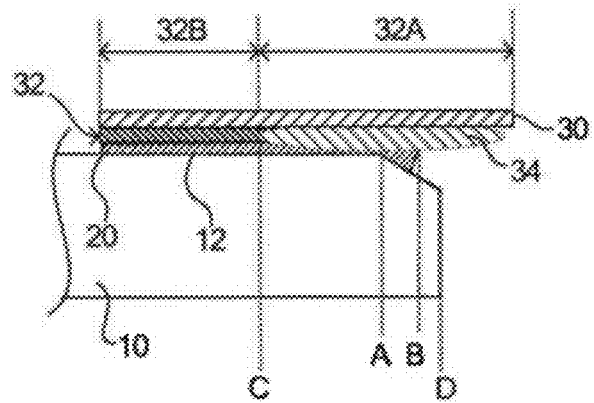
FIG. 4D is a schematic diagram illustrating positional relationship after pressure bonding Z4.

Z4 (Comparative Example; FIG. 4D): C, A, B, D

Figure 4E:
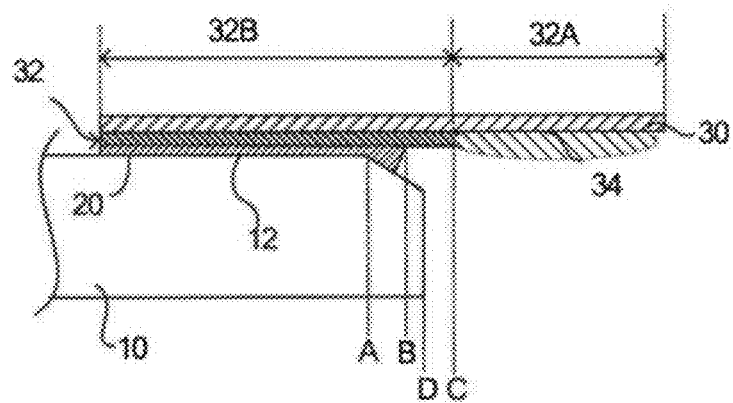
FIG. 4E is a schematic diagram illustrating positional relationship after pressure bonding Z5.

Z5 (Comparative Example; FIG. 4E): A, B, D, C

Figure 4F:
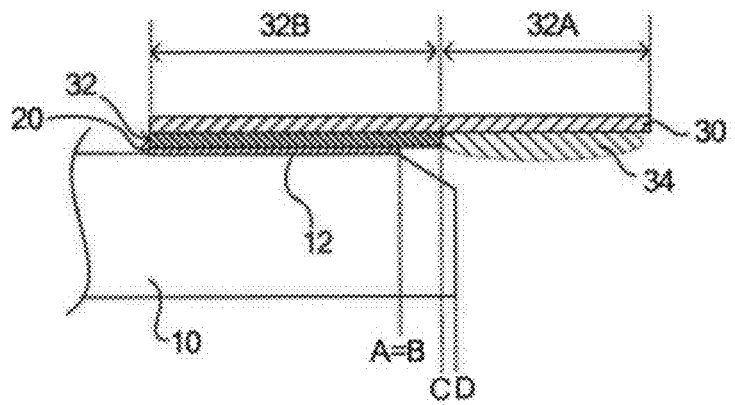
FIG. 4F is a schematic diagram illustrating positional relationship after pressure bonding Z6.
Figure 4G:
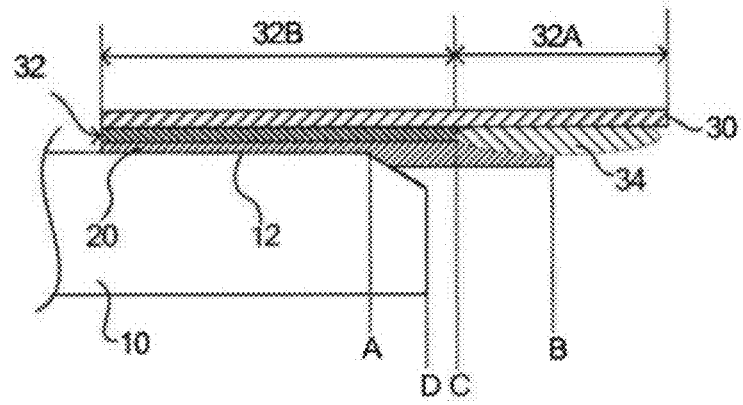
FIG. 4G is a schematic diagram illustrating positional relationship after pressure bonding Z7.
Figure 5A:
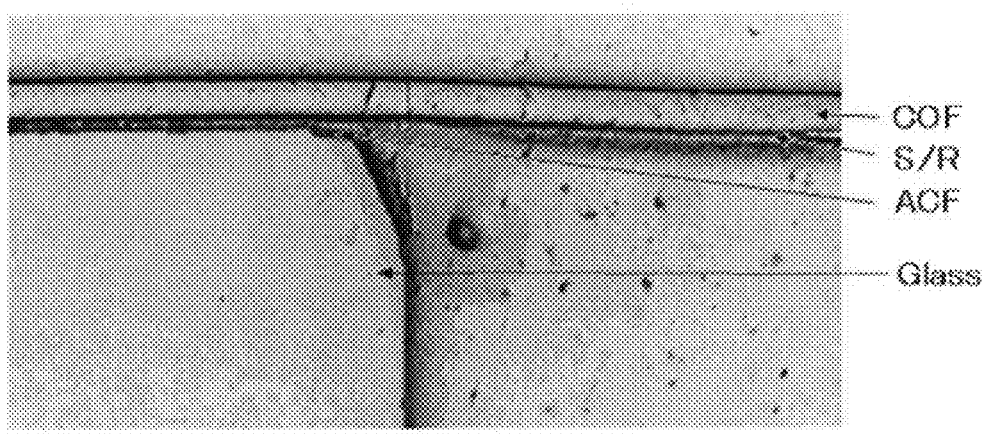
FIG. 5A is a cross-section photograph of the joined structure whose positional relationship after pressure bonding is Z1.
Figure 5B:
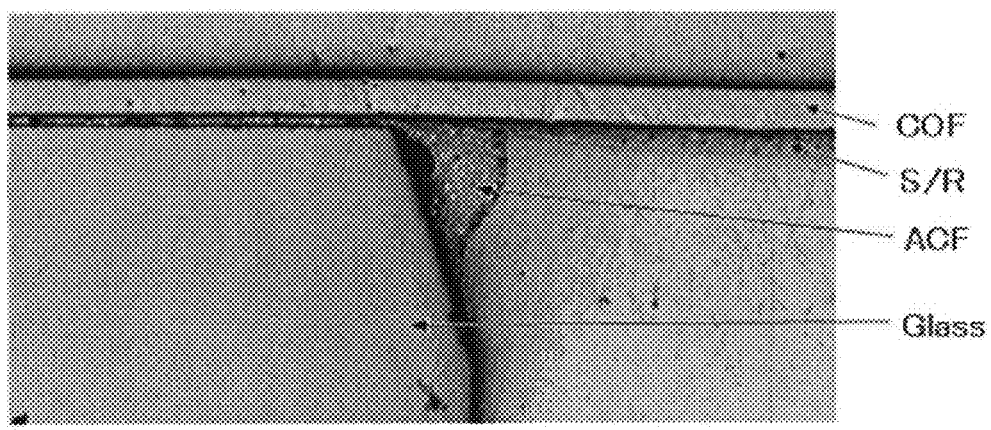
FIG. 5B is a cross-section photograph of the joined structure whose positional relationship after pressure bonding is Z2.
Figure 5C:
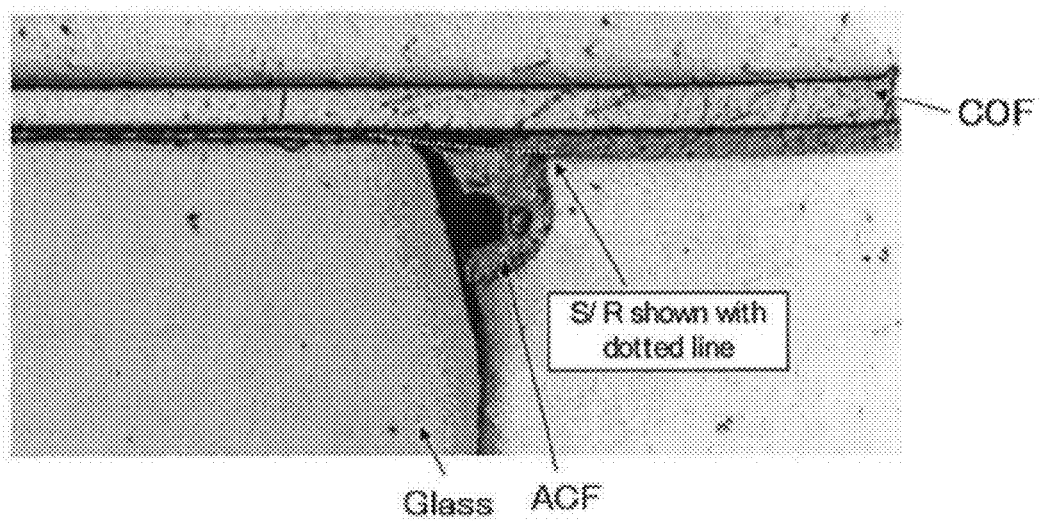
FIG. 5C is a schematic diagram illustrating positional relationship before pressure bonding Z3.
Figure 5D:
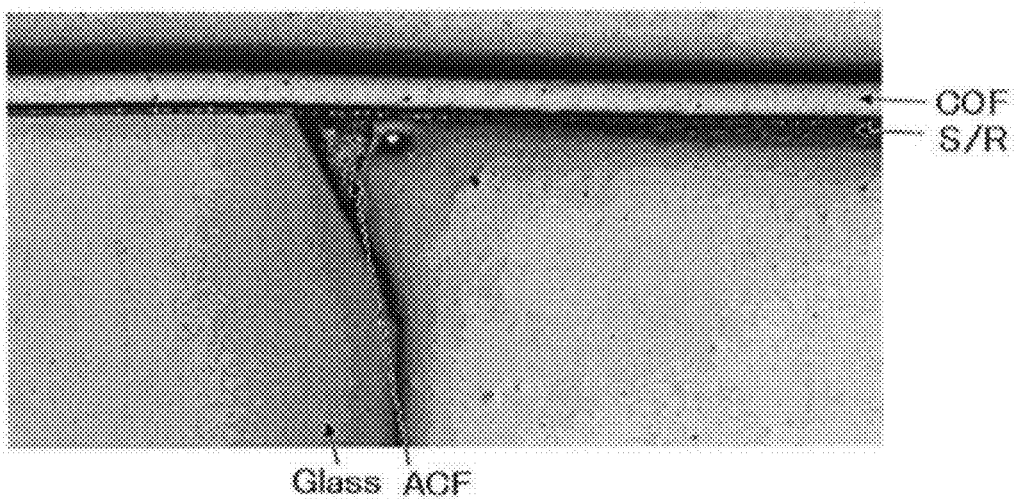
FIG. 5D is a cross-section photograph of the joined structure whose positional relationship after pressure bonding is Z5.

Z6 (Comparative Example; FIG. 4F): A=B, C, D

Z7 (Comparative Example; FIG. 40): A, D, C, B

—Connection Resistance Test—

The connection resistance value of each of the obtained joined structures with application of electric current of 1 mA was measured by a four-terminal method using a digital multimeter (DIGITAL MULTMIETER 7555, manufactured by Yokogawa Electric Corporation). The results are shown in Tables 1 and 2.

—Short Circuit Test—

In Examples 1 to 2 and Comparatives Examples 1 to 2, the ITO coating glass was replaced with raw glass (a substrate for evaluation, glass thickness of 0.7 mm, chamfer of 0.3 mm) to produce joined structures.

A Ni powder having the particle diameter of 0.2 μm was sprinkled over the chamfer part of the raw glass in the obtained joined structure, and to this vibrations were applied for 30 seconds by a pencil shaker, followed by applying a voltage of 15V between the terminals to measure insulation resistance. The obtained values were evaluated based on the following criteria. The results are shown in Tables 1 and 2.

[Evaluation Criteria]

I: No occurrence of short circuit

II: Occurrence of short circuit

—Bending Test—

In each of the joined structures prepared in Example 2 and Comparative Example 2, the COF was bent by 180° so that the solder resist of the COF met the back surface of the glass, and was fixed in this state.

Next, the rounded portion by bending was pressed against a stainless stage at a constant speed (200 mm/sec) by a tensile-compression testing machine (TENSILON RTG-1210, manufactured by A&D Company, Limited). After performing this procedure for 20 times, the COF returned to the original state, and the connection resistance was measured. The results are shown in Table 2.

TABLE 1

| | Example 1 | | | | | | | Comparative Example 1 | |
|---|---|---|---|---|---|---|---|---|---|
| Anisotropic conductive film | T2 | T3 | T4 | T5 | V1 | V2 | D1 (ACF/NCF) | T1 | V3 |
| Thickness (μm) | 10 | 15 | 30 | 35 | 15 | 15 | 15 (5/10) | 8 | 15 |
| Positional relationship before pressure bonding | | | | | Z3 | | | | Z3 |
| Positional relationship after pressure bonding | Z2 | Z2 | Z2 | Z2 | Z2 | Z2 | Z2 | Z3 | Z3 |
| Minimum melt viscosity (Pa·s) | | $3.4 \times 10^2$ | | | $4.0 \times 10^1$ | $6.3 \times 10^4$ | $2.3 \times 10^3 / 1.4 \times 10^2$ | $3.4 \times 10^2$ | $1.8 \times 10^5$ |
| Bleeding test | A | A | A | A | B | A | A | A | A |
| Connection resistance (Ω) | 1.13 | 1.12 | 1.43 | 10.02 | 1.12 | 1.15 | 1.14 | 1.11 | 4.34 |
| Short circuit test | I | I | I | I | I | I | I | II | II |

From the results presented in Table 1, it was found that the joined structures of the present invention having the positional relationship before pressure bonding of Z3, and the positional relationship after pressure bonding of Z2 had excellent connection reliability.

Since the anisotropic conductive film V1 had low minimum melt viscosity, blocking tended to occur, and the evaluation of the film reel 100M was "NG" in the bleeding test.

Since the anisotropic conductive film T1 was thin, and the anisotropic conductive film V3 had high minimum melt viscosity, the edge (B) of each of the anisotropic conductive films T1 and V3 did not flow into the edge (C) of the solder resist region of the COF with a sufficient amount, and thus the positional relationship after pressure bonding was Z3, in which an exposed wiring part was presented, so that short circuit occurred.

after pressure bonding became Z1, or Z3 to Z7, even though the anisotropic conductive film T3 was used.

In the case where the positional relationships after pressure bonding were Z1, Z3, Z5 and Z6, the COF wiring was exposed so that not only the short circuit, but also the breaking of the COF wiring occurred in the bending test due to lack of the strength, and as a result connection failures occurred.

In the case where the positional relationship after pressure bonding was Z4, moreover, the solder resist layer of the COF was present on the ITO coating glass, and this formed a step. Because of the step, sufficient pressure could not be applied to the connection part at the time of pressure bonding, and thus connection failures occurred.

In the case where the positional relationship after pressure bonding was Z7, furthermore, heat from the heat tool was not transferred to the anisotropic conductive film T3 bonded to

TABLE 2

| | Example 2 | | | Comparative Example 2 | | | | | |
|---|---|---|---|---|---|---|---|---|---|
| Anisotropic conductive film | T3 | | | T3 | | | | | |
| Positional relationship before pressure bonding | Z2 | Z3 | Z6 | Z1 | Z1 | Z4 | Z5 | Z1 | Z7 |
| Positional relationship after pressure bonding | | Z2 | | | Z1 | Z3 | Z4 | Z5 | Z6 | Z7 |
| Connection resistance (Ω) | 1.14 | 1.14 | 1.14 | 1.14 | 1.14 | x | 1.14 | 1.14 | 1.14 |
| Short circuit test | I | I | I | II | II | I | II | II | I |
| Bending test (Ω) | 1.14 | 1.14 | 1.14 | x | x | N/A | x | x | x |

Note that, in Table 2, the symbol "x" presented as the result of the connection resistance means that a connection failure occurred, and the symbol "x" presented as the result of the bending test means that the breaking of the COF wiring occurred so that a connection failure occurred.

From the results presented in Table 2, it was found that the positional relationship after pressure bonding became Z2 when the positional relationship before pressure bonding was Z2, Z3, or Z6, and such joined structures had excellent connection reliability and excellent results in the bending test.

Conversely, when the positional relationship before pressure bonding was Z1, Z4, Z5 or Z7, the positional relationship the solder resist layer of the COF, and thus the anisotropic conductive film T3 of this area was completely uncured. Therefore, breaking of the wire occurred in the bending test because the anisotropic conductive film could not support the wiring, this resulted connection failures.

Moreover, the joined structures obtained in Example 2 and Comparative Example 2 were each cut in a cross section along the terminal, and the cut surfaces were polished to confirm the positional relationship after pressure bonding. The cross-sectional photographs thereof are shown in FIGS. 5A to 5D.

Note that, in FIGS. 5A to 5D, S/R denotes a solder resist, ACF denotes an anisotropic conductive film, and Glass denotes an ITO coating glass.

It was found that in FIGS. 5A to 5D, the joined structures therein had the positional relationships of Z1, Z2, Z4, and Z5, respectively.

The method for producing a joined structure of the present invention can be suitably used for production of a joined structure that inhibits occurrences of connection failures, and has excellent connection reliability and durability. The joined structure of the present invention has excellent connection reliability and durability.

What is claimed is:

1. A joined structure, comprising:
    an anisotropic conductive film;
    a substrate containing a first electrode region formed thereon and having a chamfer part at an edge thereof; and
    a wiring member,
    wherein the anisotropic conductive film and the wiring member are joined together with the anisotropic conductive film,
    wherein one edge of the anisotropic conductive film is placed on the first electrode region of the substrate so that the one edge of the anisotropic conductive film protrudes from the inner edge of the chamfer part of the substrate towards the outer side of the substrate,
    wherein the wiring member contains a wiring plate formed thereon, where the wiring plate has a resist region in which the wiring plate is covered with a resist layer, and a second electrode region in which the wiring plate is not covered with the resist layer, and the wiring member is placed so that the edge of the resist region at a boundary with the second electrode region comes above the chamfer part of the substrate, and
    wherein the second electrode region is covered with the anisotropic conductive film.

2. A method for producing a joined structure, comprising:
    after placing an anisotropic conductive film on a first electrode region formed on a substrate having a chamfer part at an edge thereof so that one edge of the anisotropic conductive film protrudes from the inner edge of the chamfer part of the substrate towards the outer side of the substrate, or the one edge of the anisotropic conductive film meets the inner edge of the chainfer part of the substrate, placing a wiring member containing a wiring plate formed thereon, where the wiring plate has a resist region in which the wiring plate is covered with a resist layer, and a second electrode region in which the wiring plate is not covered with the resist layer, so that the edge of the resist region at a boundary with the second electrode region comes above the chamfer part of the substrate; and
    heating and compressing the anisotropic conductive film from the side of the wiring member to melt and make the anisotropic conductive film flow into the side of the resist region to thereby cover the second electrode region with the anisotropic conductive film, so as to electrically connect the first electrode region and the second electrode region,
    wherein the substrate and the wiring member are joined together with the anisotropic conductive film to form the joined structure.

3. The method for producing a joined structure according to claim 2, wherein the placing the wiring member is placing the wiring member so that the one edge of the anisotropic conductive film and the edge of the resist, region located at the boundary with the second electrode region are set apart, to thereby form an exposed wiring part in the second electrode region.

4. The method for producing a joined structure according to claim 2, wherein a width of the anisotropic conductive film protruding from the inner edge of the chamfer part of the substrate is 0% to 50% of a width of the anisotropic conductive film.

5. The method for producing a joined structure according to claim 2, wherein the anisotropic conductive film has the minimum melt viscosity of $5.0\times10^1$ Pa·s to $1.0\times10^5$ Pa·s, and a thickness of 120% to 400% relative to the total height of a terminal in the first electrode region and a terminal in the second electrode region.

6. The method for producing a joined structure according to claim 2, wherein the anisotropic conductive film contains an insulating layer and a conductive layer, where the insulating layer contains an insulating resin, and the conductive layer contains an insulating resin and conductive particles, and
    wherein the insulating layer has the minimum melt viscosity of $5.0\times10^1$ Pa·s to $1.0\times10^5$ Pa·s, and the conductive layer has the minimum melt viscosity which is larger than the minimum melt viscosity of the insulating layer by 10 times or more.

* * * * *

UNITED STATES PATENT AND TRADEMARK OFFICE
CERTIFICATE OF CORRECTION

| | |
|---|---|
| PATENT NO. | : 8,330,052 B2 |
| APPLICATION NO. | : 13/242712 |
| DATED | : December 11, 2012 |
| INVENTOR(S) | : Tomoyuki Ishimatsu et al. |

It is certified that error appears in the above-identified patent and that said Letters Patent is hereby corrected as shown below:

Column 15, Line 45

Delete "of the cha infer part" and replace it with -- of the chamfer part --

Signed and Sealed this
Nineteenth Day of March, 2013

Teresa Stanek Rea
*Acting Director of the United States Patent and Trademark Office*